(12) United States Patent
Lin et al.

(10) Patent No.: US 7,790,503 B2
(45) Date of Patent: Sep. 7, 2010

(54) SEMICONDUCTOR DEVICE AND METHOD OF FORMING INTEGRATED PASSIVE DEVICE MODULE

(75) Inventors: Yaojian Lin, Singapore (SG); Haijing Cao, Singapore (SG); Qing Zhang, Singapore (SG); Kang Chen, Singapore (SG); Jianmin Fang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 113 days.

(21) Appl. No.: 11/958,603

(22) Filed: Dec. 18, 2007

(65) Prior Publication Data
US 2009/0155959 A1 Jun. 18, 2009

(51) Int. Cl.
*H01L 21/00* (2006.01)
(52) U.S. Cl. .............................. 438/107; 257/E21.499
(58) Field of Classification Search ................ 438/107, 438/108; 257/E21.499
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,689,138 A | 11/1997 | Dekker et al. | |
| 5,841,193 A | 11/1998 | Eichelberger | |
| 6,803,303 B1 * | 10/2004 | Hiatt et al. ................... 438/612 |
| 6,976,056 B1 | 12/2005 | Kumar | |
| 7,619,901 B2 | 11/2009 | Eichelberger et al. | |
| 2005/0073055 A1 * | 4/2005 | Pan et al. ..................... 257/778 |
| 2005/0253255 A1 | 11/2005 | Degani et al. | |
| 2006/0217102 A1 | 9/2006 | Degani et al. | |
| 2007/0040258 A1 * | 2/2007 | Sheats ......................... 257/686 |
| 2007/0065964 A1 | 3/2007 | Degani et al. | |
| 2007/0114634 A1 | 5/2007 | Lin et al. | |
| 2007/0114651 A1 | 5/2007 | Marimuthu et al. | |
| 2007/0176287 A1 | 8/2007 | Crowley et al. | |
| 2007/0235878 A1 | 10/2007 | Lin et al. | |

* cited by examiner

*Primary Examiner*—W. David Coleman
(74) *Attorney, Agent, or Firm*—Robert D. Atkins

(57) ABSTRACT

A method of manufacturing a semiconductor device includes providing a substrate with an insulation layer disposed on a top surface of the substrate, forming a passive device over the top surface of the substrate, removing the substrate, depositing an insulating polymer film layer over the insulation layer, and depositing a metal layer over the insulating polymer film layer. A solder mask can be formed over the metal layer. A conformal metal layer can then be formed over the solder mask. A notch can be formed in the insulation layer to enhance the connection between the insulating polymer film layer and the insulation layer. Additional semiconductor die can be electrically connected to the passive device. The substrate is removed by removing a first amount of the substrate using a back grind process, and then removing a second amount of the substrate using a wet dry, dry etch, or chemical-mechanical planarization process.

22 Claims, 10 Drawing Sheets

SEMICONDUCTOR DEVICE AND METHOD OF FORMING INTEGRATED PASSIVE DEVICE MODULE

FIELD OF THE INVENTION

The present invention relates in general to semiconductor devices and, more particularly, to a method of fabricating a system in a package (SiP) having integrated passive devices, surface mounted devices, and printed circuit board (PCB) components.

BACKGROUND OF THE INVENTION

Semiconductors, or computer chips, are found in virtually every electrical product manufactured today. Chips are used not only in very sophisticated industrial and commercial electronic equipment, but also in many household and consumer items such as televisions, clothes washers and dryers, radios, and telephones. As products become smaller but more functional, there is a need to include more chips in the smaller products to perform the functionality. The reduction in size of cellular telephones is one example of how more and more capabilities are incorporated into smaller and smaller electronic products.

As electronic products become increasingly miniaturized, it is desirable to combine several chips into a single system package. By combining what were previously separate and distinct chips into a single package, manufacturing costs can be greatly reduced. Although preferable, the integration of chips formed using thin film processing techniques on wafers with other chips and packages can present many challenges. For example, today's thin-film manufacturing processes require the use of expensive, specialty substrate materials when forming SiPs. Although a PCB may be used as a substrate, they are relatively delicate and may be damaged by the high temperatures used during thin-film processing. Also, in today's SiP devices, any connected IC chips are generally limited to a 2D layout configuration. As a result, the number of IC chips that can be coupled directly to a substrate is greatly limited in accordance with the geometry of that substrate. Finally, if components or additional devices are mounted to a backside of a substrate using conventional technologies, it may be necessary to use through substrate vias (TSVs) to electrically connect the attached components to the internal electrical structure of the substrate. TSVs are difficult and expensive to produce, so their use greatly increases the cost of the completed device.

SUMMARY OF THE INVENTION

A need exists for a method of forming a system in a package having integrated thin film devices, surface mount technology devices, and printed circuit board devices. In addition, a need exists for manufacturing techniques for the system as described which reduce process steps, resulting in shorter cycle time and lower cost.

In one embodiment, the present invention is a method of manufacturing a semiconductor device comprising the steps of providing a substrate with an insulation layer disposed on a top surface of the substrate, forming an integrated passive circuit over the top surface of the substrate, removing the substrate, depositing an insulating polymer film layer over the insulation layer, and forming an interconnect structure over the insulating polymer film layer.

In another embodiment, the present invention is a method of manufacturing a semiconductor device comprising the steps of providing a substrate with an insulation layer disposed on a top surface of the substrate, forming an integrated passive circuit over the top surface of the substrate, removing the substrate, and mounting a printed circuit board over the insulation layer. The printed circuit board includes an insulating polymer film layer and an interconnect structure deposited over the insulating polymer film layer.

In another embodiment, the present invention is a method of manufacturing a semiconductor device comprising the steps of providing a substrate having an insulation layer disposed on a top surface of the substrate, and forming an integrated passive circuit over the substrate by depositing a conductive layer over the substrate and depositing a dielectric layer over the substrate. The method further includes forming a passivation layer over the integrated passive circuit, etching a first opening in the passivation layer to expose a first surface of the integrated passive circuit, removing the substrate, etching a first opening in the insulation layer to expose a second surface of the integrated passive circuit, depositing an insulating polymer film over the insulation layer, and forming a metal layer over the insulating polymer film. The metal layer contacts the second surface of the integrated passive circuit.

In another embodiment, the present invention is a method of manufacturing a semiconductor device comprising the steps of providing a substrate with an insulation layer deposited on a top surface of the substrate, forming an integrated passive circuit over the top surface of the substrate, surface mounting IC dies or discrete components on a first surface of the integrated passive circuit with flip-chip or wire bonding, molding the wafer with dielectric molding material, removing the substrate, depositing an insulating polymer film layer over the insulation layer, and depositing an interconnect structure over the insulating polymer film layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

A system in a package having integrated passive devices, surface-mounted devices, and PCB-based devices can be manufactured which serves to alleviate the cost and difficulty associated with combining a plurality of devices into a single package. Moreover, the system can be manufactured using less process steps and cheaper materials, which contributes to shorter cycle time and lower overall cost.

Figure 1:
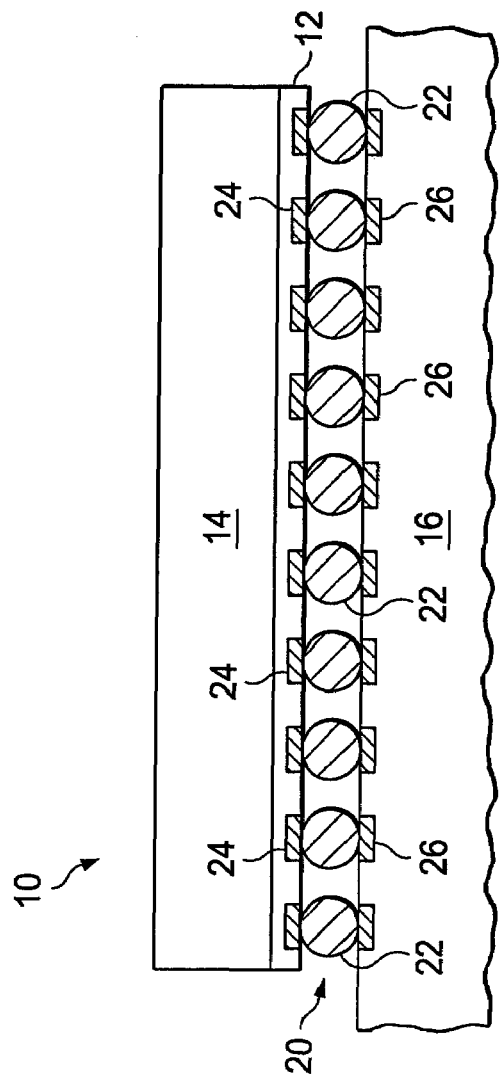
FIG. 1 illustrates an example semiconductor device.

A mounted semiconductor device is shown in FIG. 1. Device 10 involves mounting an active area 12 of die 14 face down toward a chip carrier substrate or PCB 16. Active area 12 may contain active and passive devices, conductive layers, and dielectric layers according to the electrical design of die 14. The electrical and mechanical interconnect between die 14 and substrate or PCB 16 is achieved through a solder bump structure 20 comprising a large number of individual conductive solder bumps or balls 22. The solder bumps are formed on bump pads or interconnect sites 24, which are disposed on active area 12 of die 14. Bump pads 24 connect to the active circuits of die 14 by conduction tracks formed in active area 12. Solder bumps 22 are electrically and mechanically connected to contact pads or interconnect sites 26 on carrier substrate or PCB 16 by a solder reflow process. The semiconductor device provides a short electrical conduction path from the active devices on die 14 to conduction tracks on carrier substrate or PCB 16 in order to reduce signal propagation, lower capacitance, and achieve overall better circuit performance.

Figure 2A:
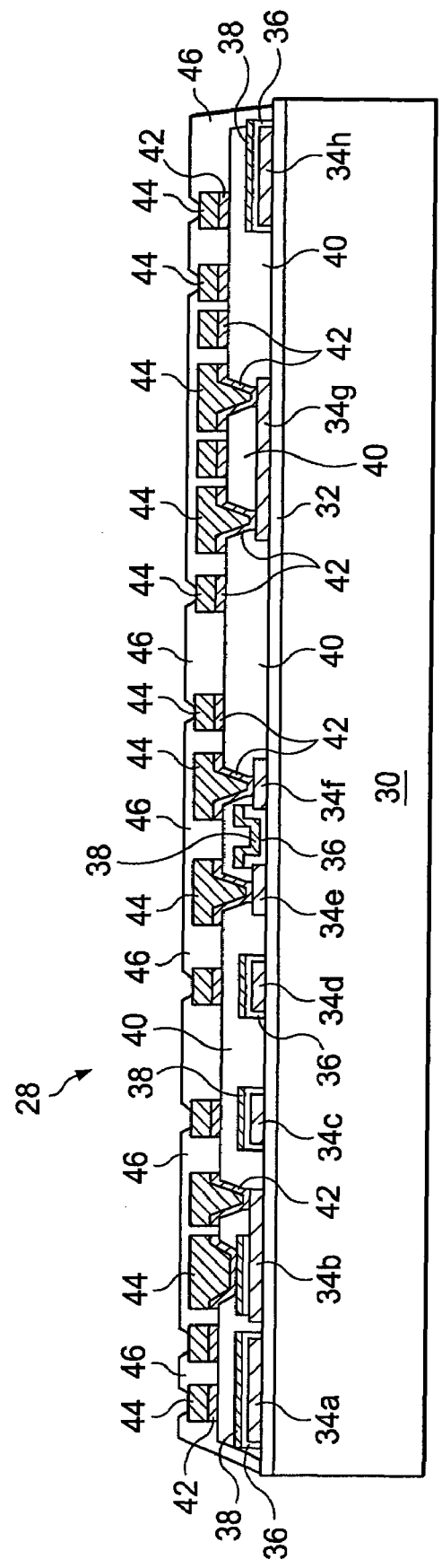
FIGS. 2a-2f illustrate a process of forming a system in a package.

Turning to FIG. 2a, a first step in manufacturing a system in a package with integrated thin film devices, surface-mounted devices, and PCB-based devices is shown. Semiconductor wafer 28 has substrate 30, over which insulation layer 32 is disposed. Substrate 30 generally includes a dummy wafer or substrate material such as a sacrificial silicon (Si) wafer or any other suitable glass wafer. Accordingly, substrate 30 uses cheaper materials than conventional substrates and can therefore be sacrificed during manufacture. The insulation layer 32 is an optional layer. When present, it allows substrate 30 to be electrically isolated from the other layers of wafer 28. Insulation layer 32 can also act as an etch stop layer. As such, during removal of substrate 30, insulation layer 32 can be used to detect an end-point of substrate 30 to prevent damage to the components formed over substrate 30 and insulation layer 32. Insulation layer 32 can include any suitable material and can be formed in multiple layers. For example, it may include layers of silicon dioxide (SiO2), silicon nitride (Si3N4), silicon oxy-nitride (SiON), or any other material with good selectivity for silicon etchant. The deposition of insulation layer 32 may involve physical vapor deposition (PVD) or chemical vapor deposition (CVD).

A conductive layer 34a-34g is deposited and patterned over insulation layer 32. Conductive layer 34 forms terminals of various integrated passive devices including a capacitor (34b), resistor (34e and 34f), and inductor (34g). In alternative embodiments, additional system components or passive devices such as transistors, diodes or other dissipative and energy-neutral devices can be formed. Conductive layer 34 can be made with aluminum (Al), aluminum alloys, copper (Cu), nickel (Ni), gold (Au), silver (Ag), salicide, polysilicon, or other electrically conductive material suitable for deposition on a substrate. A PVD, CVD, electrolytic plating, or electroless plating process can be used to form conductive layer 34.

Resistive layer 36 is formed over conductive layer 34 and insulation layer 32. Resistive layer 36 can be any suitable material, including nickel-chromium (NiCr), metal silicide, tantalum nitride (TaN), and polysilicon having high electrical resistance. The deposition of resistive layer 36 may involve PVD or CVD.

A dielectric layer 38 is patterned and formed over resistive layer 36. Dielectric layer 38 forms parts of various passive circuit elements including a capacitor, resistor, and inductor, and supporting contact pads 34a and 34h. Dielectric layer 38 can be silicon nitride (SiN), tantalum oxide (Ta2O5), hafnium oxide (HfO2), or a dielectric film material. In an alternative embodiment, resistive layer 36 is formed over dielectric layer 38.

Next, passivation layer 40 is deposited over insulation layer 32, conductive layer 34, resistive layer 36, and dielectric layer 38. Passivation layer 40 can be patterned to create various openings, thereby exposing one or more of the lower layers of wafer 28. In FIG. 2a, passivation layer 40 is patterned and etched to expose portions of conductive layer 34 and dielectric layer 38. Passivation layer 40 can include any suitable insulation material such as polyimide, benzocyclobutene (BCB), PBO (polybenzoxazoles), epoxy based insulating polymer, or other insulating polymer materials. Passivation layer 40, like all further passivation layers, provides physical support to and electrical insulation between the layers of wafer 28.

Conductive layer 42 is deposited over passivation layer 40. Conductive layer 42, like conductive layer 34, may include any suitable material and be formed by any suitable method. As shown on FIG. 2a, by virtue of the patterns formed in passivation layer 40, conductive layer 42 contacts portions of conductive layer 34 and dielectric layer 38. In alternative embodiments, passivation layer 40 can be etched so that conductive layer 42 also contacts resistive layer 36. Conductive layer 42 acts as an adhesion layer to facilitate deposition of conductive layer 44 onto wafer 28. In an alternative embodiment, a diffusion barrier material can be deposited between conductive layer 42 and conductive layer 44 to enhance the physical and/or electrical connection between the two layers.

Conductive layer 44 is patterned and formed over conductive layer 42. Conductive layer 44, like conductive layer 34, may include any suitable material and be formed by any suitable process. In one embodiment, for example, conductive layer 42 includes titanium (Ti) and conductive layer 44 includes Cu.

Finally, passivation layer 46 is formed over conductive layer 44 and all lower layers, as shown on FIG. 2a. Passivation layer 46, like passivation layer 40, may include any suitable material and be formed using any suitable method. Passivation layer 46 provides structure support and can be patterned to expose one or more of the lower layers of wafer 28. For example, in FIG. 2a, passivation layer 46 is etched to expose portions of conductive layer 42 and conductive layer 44.

Depending upon the application, the device can be made using different combinations of metal, dielectric, insulator, and passivation layers. For example, some applications may require that additional metal and dielectric layers be formed on wafer 28, or that some be removed. Also, one or more ground planes can be formed on wafer 28 during the fabrication process. Similarly, additional interconnection capability for the device may be achieved by the addition of patterned metal interconnection layers.

In alternative embodiments, capacitors can be formed in the device using a metal-insulator-metal (MIM) configuration. In that case, two single metal layers can be formed over substrate 30 having a dielectric layer disposed between. Additional resistive layers can also be formed between the two metal layers to alter the properties of the capacitors. In one example, plasma deposited SiN, Ta2O3, or anodized aluminum oxide films are deposited between the metal layers and may greatly increase the capacitance of the capacitors.

In FIG. 2a, the integrated passive devices include a capacitor formed by conductive layers 44 and 42, dielectric layer 38, resistive layer 36, and conductive layer 34b. The integrated passive devices further include a resistor formed by conductive layers 34e, resistive layer 36, and conductive layer 34f. The integrated passive devices further include an inductor formed by conductive layers 44, 42, and 34g. The inductor can be formed on wafer 28 as single-layer or stacked spiral inductor components. Generally, stacked spiral inductors provide a higher inductance/unit area, however a single-layer spiral inductor provides a better Q value. A spiral inductor can be formed in as few as two metal layers with an insulative layer disposed in between. First, a spiral design is patterned in the first metal layer and an inner portion of the spiral is electronically coupled to the second metal layer using a via formed through the insulative layer. In such an inductor, the metal layers can be formed from high-conductivity metals such as Cu, Ag, or Au. One or more the integrated passive devices can be interconnected as a passive circuit according to the electrical function of the device.

Figure 2B:
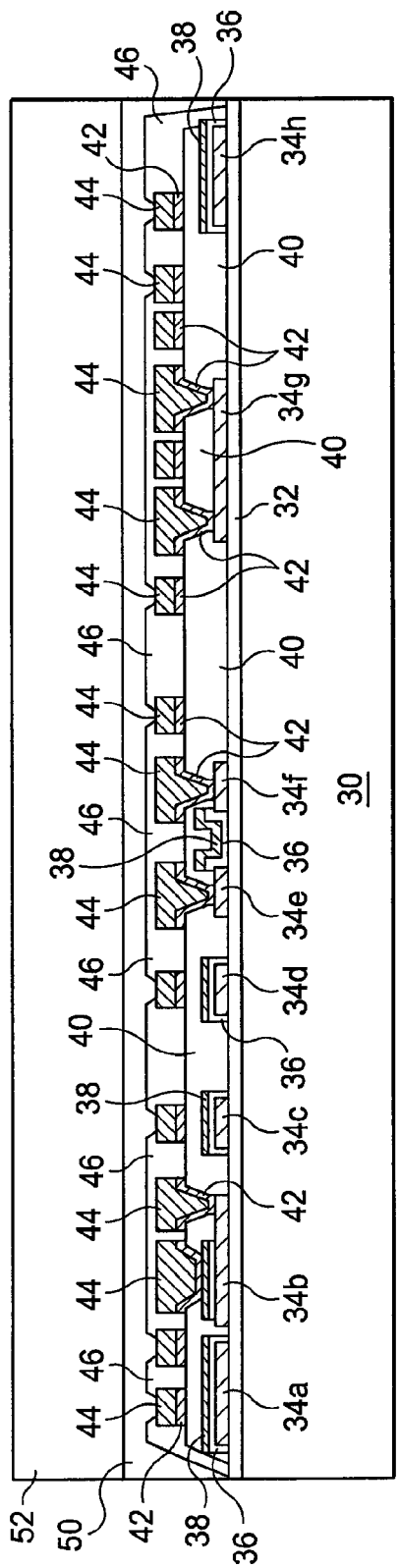

Referring to FIG. 2b, adhesive layer 50 is deposited over passivation layer 46. A temporary wafer carrier 52 is then bonded to passivation layer 46 using adhesive layer 50. Temporary wafer carrier 52 can be glass, Si, ceramic, metal, polymer composite, or other rigid material.

Figure 2C:
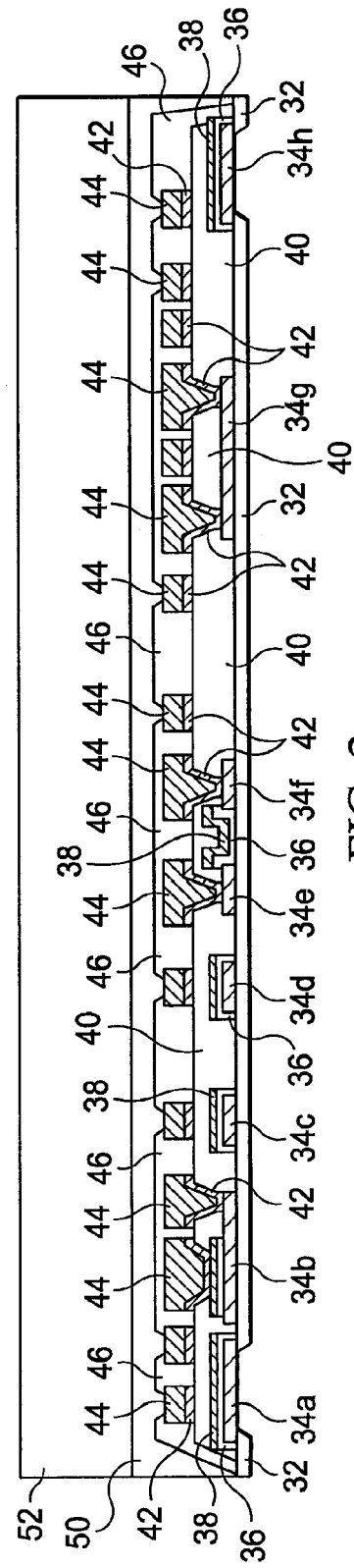

FIG. 2c shows the removal of substrate 30 and patterning of insulation layer 32. Substrate 30 is removed by mechanical back grinding with an additional wet etching step. Alternatively, plasma etching and/or a chemical-mechanical planarization (CMP) process can be used. In the present embodiment, a majority of substrate 30 is initially removed using a back grind process that leaves approximately 10-25 μm of substrate 30 remaining. The remaining substrate 30 is removed using a wet dry, dry etch, or CMP process. After removal of substrate 30, insulation layer 32 is exposed.

Insulation layer 32 is etched to create vias exposing portions of conductive layer 34a and 34h. In one embodiment, insulation layer 32 is opened using a laser drill, together with an optional via formed in the following process.

Figures 2D, 2E:
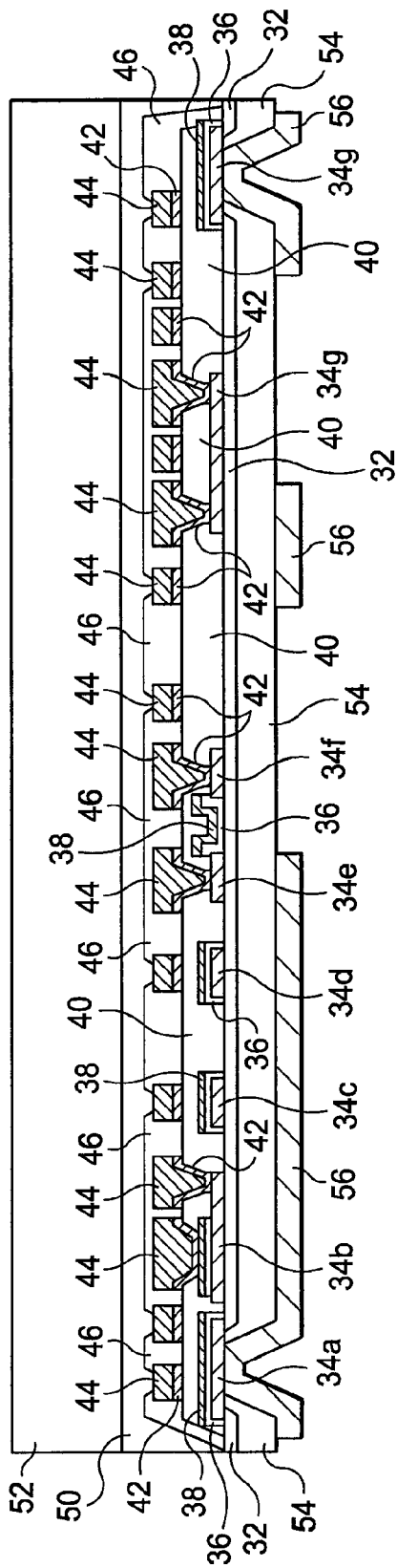

Referring to FIG. 2d, insulating polymer film 54 is applied to the backside of wafer 28 over insulation layer 32. Polymer film 54 can be applied using any suitable process such as lamination, printing, spray coating, or spin coating. After it is applied, polymer film 54 is etched to expose portions of conductive layer 34a and 34h. Polymer film 54 can be etched using photo-lithography or a laser drilling system. When formed, polymer film 54 may be greater than 0.5 microns (μm) thick. However, in some applications, polymer film 54 is thicker than 50 μm. In the present embodiment, polymer film 54 includes a high resistivity material having, for example, a resistance of greater than 1 kΩcm. Polymer film 54 may include polyimide, BCB, PBO, epoxy resin, or WPR-dielectric materials. Polyimide materials generally have a dielectric constant around 3.3 and resistivity around 2.4E15 Ωcm. Epoxy resin generally has a dielectric constant around 4.4 and resistivity around 1.0E15 Ωcm. WPR-dielectric materials generally have a dielectric constant around 3.6 and resistivity around 1.0E15 Ωcm.

Metal layer 56 is deposited over polymer film 54. In the present embodiment, metal layer 56 is Cu and is typically thicker than 15 μm. However, in alternative embodiments, the thickness of metal layer 56 may range from approximately 3 to 25 μm and is typically 12 μm. Metal layer 56 can be formed from any suitable metal such as Au, Ag, Al, aluminum alloys, Cu, Sn, or Ni. Depending upon the application, it may be preferable that metal layer 56 be routed so as to avoid passing directly beneath one or more of the integrated passive devices formed within wafer 28. For example, with reference to FIG. 2d, metal layer 56 is deposited so as to avoid passing directly beneath the inductor because metal layer 56 and signals traveling through metal layer 56 can interfere with the operation of the inductor or other passive devices. Metal layer 56 may act as a ground plane.

Turning now to FIG. 2e, additional metal and insulating polymer film layers can be added to the semiconductor device in a similar manner to that used to form polymer film 54 and metal layer 56. The insulating polymer film 62 is deposited over polymer film 54 and metal layer 56. A metal layer 64 is deposited over metal layer 56 and polymer film 62. Metal layer 64 forms inductors and strip lines having other performance values. Over those layers, insulating polymer film 66 is deposited. Metal layer 68 is deposited over polymer film 66. The combination of metal layers 56, 64, and 68, with insulation layers 54 and 66, constitute an interconnect structure which electrically connects with metal layers 34, 42, and 44 to provide a complete electrical interconnection for the integrated passive devices and other semiconductor die within the semiconductor package.

Metal layer 68 can form separate ground planes, inductors, and/or transmission lines. The insulating polymer film layers may include a single polymer material such as polyimide or epoxy resin, or a polymer composite having an added filler material or fiber material. For most applications, the polymer film layers should have high resistivity and a low loss tangent when exposed to high frequency electromagnetic radiation. A resistivity of 1 kΩcm and a loss tangent of 0.01 would be satisfactory for most applications. In one embodiment, the substrate material MSL-BE-67G(H) manufactured by Hitachi can be used. It has a loss tangent of 0.01 at 2 GHz, and a resistivity of 1E15 Ωcm. The additional polymer film layers are etched to allow for interconnectivity between the additional metal layers.

Finally, solder mask 72 is formed over metal layer 68 and polymer film 66. Solder mask 72 is patterned to expose portions of metal layer 68.

Depending upon the final application, any combination of additional metal layers and additional polymer film layers can be added to the semiconductor device. For example, in some applications, a single metal layer and polymer film layer will be sufficient to provide the necessary electrical interconnectivity between the devices formed in wafer 28 and additional external components. In other embodiments, however, several additional metal and polymer film layers are added to the semiconductor device to provide a PCB interconnect structure. In some embodiments, the additional metal layers can form specific system components such as interconnect circuits, ground planes, and strip lines.

The addition of interconnect circuits facilitates electronic communication between system components that are coupled to wafer 28 and system components that are formed within or on wafer 28. The interconnections can be formed in any suitable configuration depending upon the system application.

A ground plane is a metal layer that can provide an electrical ground connection for passive devices formed on wafer 28. Ground planes also provide an optional ground connection for discrete components that are coupled to wafer 28. Generally, ground planes reduce noise and cross-talk between the passive components, and between the passive components and other components of the semiconductor device.

Transmission lines or strip lines include a metal material and act as a transmission line by absorbing and emitting electromagnetic radiation. Accordingly, strip lines facilitate signal matching, signal transmission and further ensure radio frequency (RF) signal integrity of the system. Generally, strip line antennas comprise a strip of metal formed between two parallel ground planes. A dielectric material is disposed between the ground planes and around the metal strip. The geometric properties of the metal strip, the distance between the strip and the ground planes and the relative permittivity of the dielectric material determine the characteristic impedance of the transmission line. Alternatively, strip lines can be in the form of a microstrip antenna. In such a configuration, strip lines comprise a metal strip separated from a single ground plane by a dielectric material.

In an alternative embodiment, polymer film 54 and metal layer 56 are formed as described above. However, rather than depositing additional metal layers and polymer film layers directly over polymer film 54 and metal layer 56, additional polymer film layers and metal layers are first formed using a separate conventional PCB fabrication process. Once formed, the combination of additional metal layers and polymer film layers is aligned with and then bonded to polymer film 54 and metal layer 56. The prefabricated PCB containing additional metal and polymer film layers can be bonded to polymer film 54 and metal layer 56 using any suitable process such as those described above. Alternatively, they can be bonded by depositing a conformal metal layer over the PCB, wherein the conformal metal layer contacts and bonds to metal layer 56. For example, with reference to FIG. 2e, metal layer 68 is conformal and is connected to metal layer 56 in this manner. After bonding, the additional metal layers and additional polymer films are laser drilled to open vias providing access to metal layer 56.

In a further alternative embodiment, a separate PCB can be connected directly to insulation layer 32. In that case, in accordance with methods described above, vias can be opened in the PCB that expose insulation layer 32 and conductive layer 34. A conformal metal layer can then be deposited over the PCB that connects to conductive layer 34 to further connect the PCB to wafer 28.

In the present embodiment, the additional PCB is configured to avoid routing the additional metal layers directly underneath the passive devices formed on wafer 28, thereby avoiding the high frequency loss of passive components such as inductors.

Figure 2F:
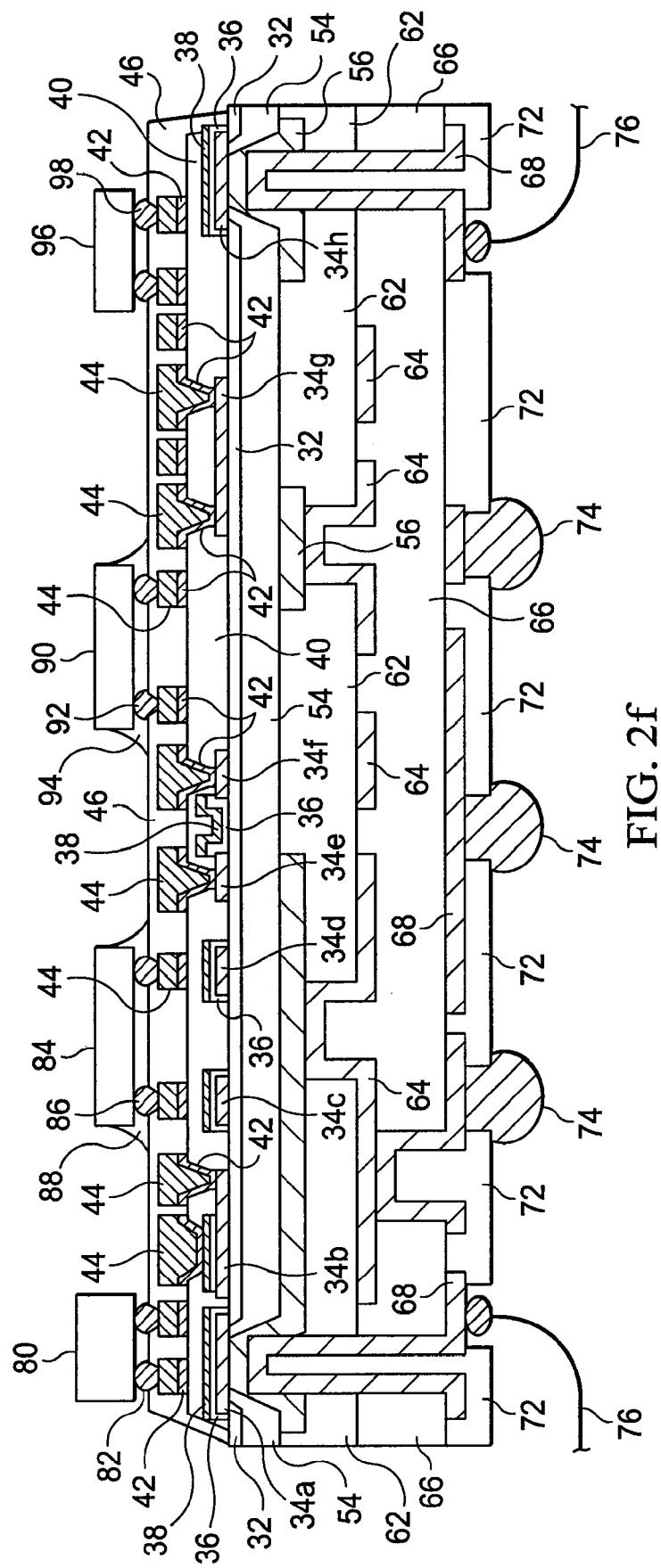

Turning to FIG. 2f a final step in the fabrication of the semiconductor device is shown. First, temporary wafer carrier 52 and adhesive layer 50 are removed by a thermal or ultra violet (UV)-cure process and cleaned using solvent soaking and/or plasma cleaning. Once clean, discrete components or semiconductor die can be coupled to conductive layer 44. The components can be coupled using any suitable process. For example, with reference to FIG. 2f, component 80 can be a discrete passive device, component 84 can be a digital integrated circuit (IC), component 90 can be a radio frequency IC, and component 96 can be a surface acoustic wave filter. These components are connected to conductive layer 44 using bumps 82, 86, 92, and 98. Using this method, any combination of passive devices, active devices, discrete passive devices, other IC chips, or discrete packages can be connected to wafer 28.

Bumps 82, 86, 92, and 98 form an electrical and mechanical interconnect between components 80, 84, 90, and 96 and conductive layer 44. Bumps 82, 86, 92, and 98 are formed by a reflow process applied to solder material deposited upon the exposed portions of conductive layer 44 and the contact pads of components 80, 84, 90, and 96. In alternative embodiments, bumps 82, 86, 92, and 98 are formed from Au, or Cu structures or any other suitable material such as tin/lead (Sn/Pb), Copper/Zinc (CuZn), or Copper/Silver (CuAg) solder each containing an optional flux material. Bumps 82, 86, 92, and 98 can be electrically connected to any of the passive devices formed within wafer 28 via any suitable interconnect structure. In an alternative embodiment, additional components 80, 84, 90, and 96 are coupled to wafer 28 before the additional metal layers and additional polymer film layers.

Components 80, 84, 90, and 96 can be coupled to conductive layer 44 using an alternative process such as SMT, and wire bonding. Optional underfill 88 and 94 can be deposited under components 80, 84, 90, and 96 to provide mechanical support and to act as a heat bridge for components 80, 84, 90, and 96 and wafer 28. Underfill 88 and 94 may include epoxy, polymeric material, film, or other non-conductive material.

With attached components 80, 84, 90, and 96, the semiconductor device can then be connected to other components or systems using a flip-chip or wire-bonding process. With reference to FIG. 2f, wire-bond pads and leads 76 are connected to metal layer 68 using a suitable process that combines heat, pressure, and/or ultrasonic energy to form a mechanical and electrical bond between wire-bond pads and leads 76 and metal layer 68. Depending upon the application, wire-bond pads and leads 76 can be electrically connected to the passive devices formed on wafer 28 via a metal interconnect network. The wire bonds and wire bond pads can be formed by any suitable method or conductive material. Also shown on FIG. 2f are bumps 74 that are connected to metal layer 68. Bumps 74 are coupled to metal layer 68 to facilitate connection of the semiconductor device to additional components such as a PCB or memory circuit. Bumps 74 can be formed using a ball drop or stencil printing process. Bumps 74 can also be connected to the passive components formed on wafer 28 by a metal interconnect network. The interconnects between bump 74 and the passive components can be patterned in any suitable manner depending upon the requirements of the application.

Figure 3:
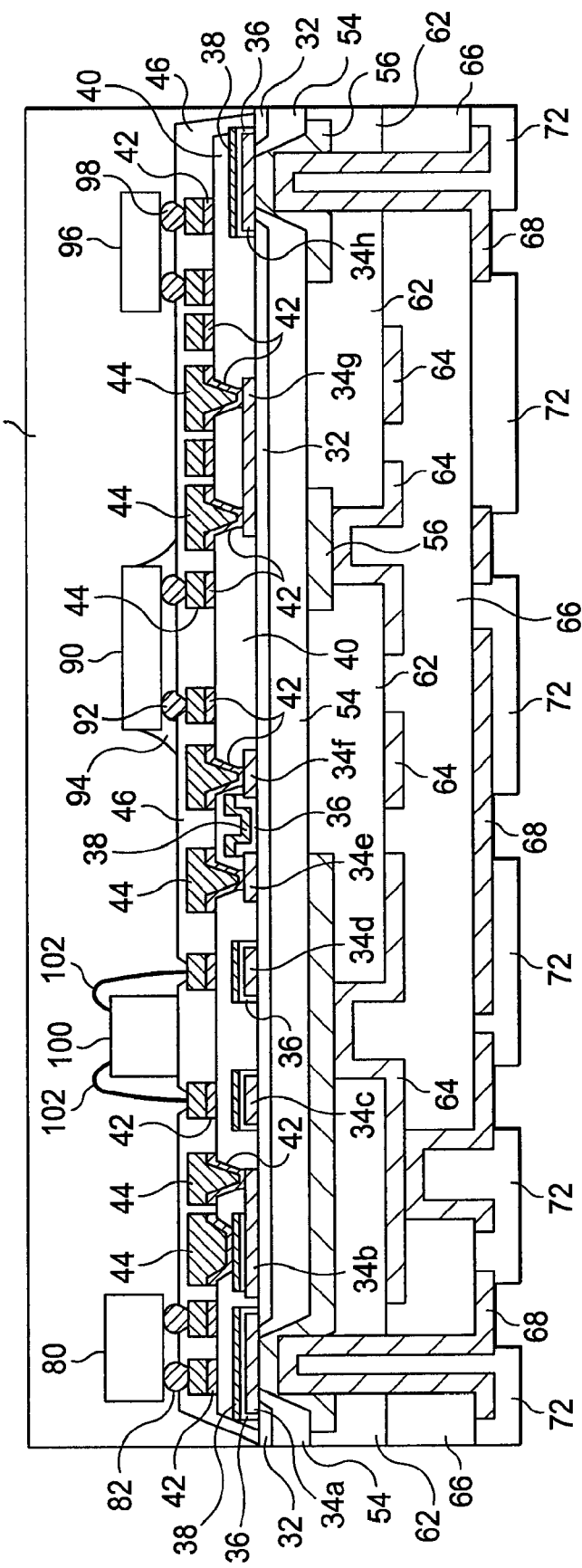
FIG. 3 illustrates a system in a package with attached discrete components.

Turning to FIG. 3, digital IC 100 is connected to conductive layer 44 using a wire-bonding process. Accordingly, wires 102 connect contact pads formed on a surface of digital IC 100 to conductive layer 44. In alternative embodiments, any suitable component can be coupled to conductive layer 44 using a wire-bonding process. In the present embodiment, mold compound or encapsulant 104 is also disposed over components 80, 100, 90, and 96 and passivation layer 46. Encapsulant 104 can be deposited after components 80, 100, 90, and 96 are coupled to conductive layer 44. In this embodiment, the step of providing adhesive layer 50 and temporary wafer carrier 52 is bypassed.

Figure 4:
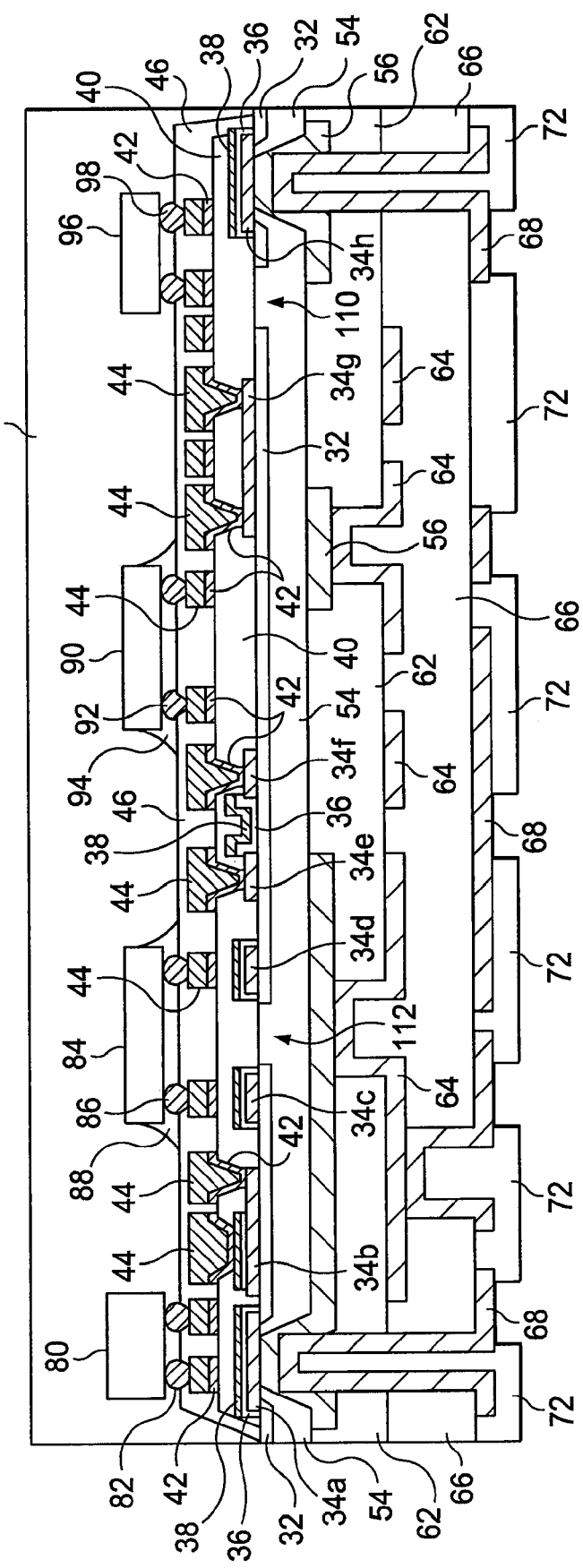
FIG. 4 illustrates a system in a package with notches formed in an insulation layer of the wafer.

Turning to FIG. 4, notches 110 and 112 are removed from insulation layer 32. Notches 110 and 112 can have any suitable shapes depending upon the application. Having formed notches 110 and 112, during formation of polymer film 54 over insulation layer 32, polymer film 54 penetrates notches 110 and 112. By entering notches 110 and 112, polymer film 54 is better bonded to insulation layer 32 providing for a system having better physical integrity. During this process, the formation of adhesive layer 50 and temporary wafer carrier 52 can be bypassed with mold compound or encapsulant 104 being disposed over passivation layer 46 and components 80, 84, 90, and 96 instead.

In a further alternative embodiment, notches 110 and 112 can be formed in both insulation layer 32 and passivation layer 40, thereby allowing polymer film 54 to bond to both layers further increasing the physical integrity of the connection. The notches are formed during the etching of insulation layer 32 using an intentional over-etching into passivation layer 40. There will be undercut into passivation layer 40 with insulation layer 32 as the etching mask. The undercut allows for an enhanced anchoring effect.

Figure 5:
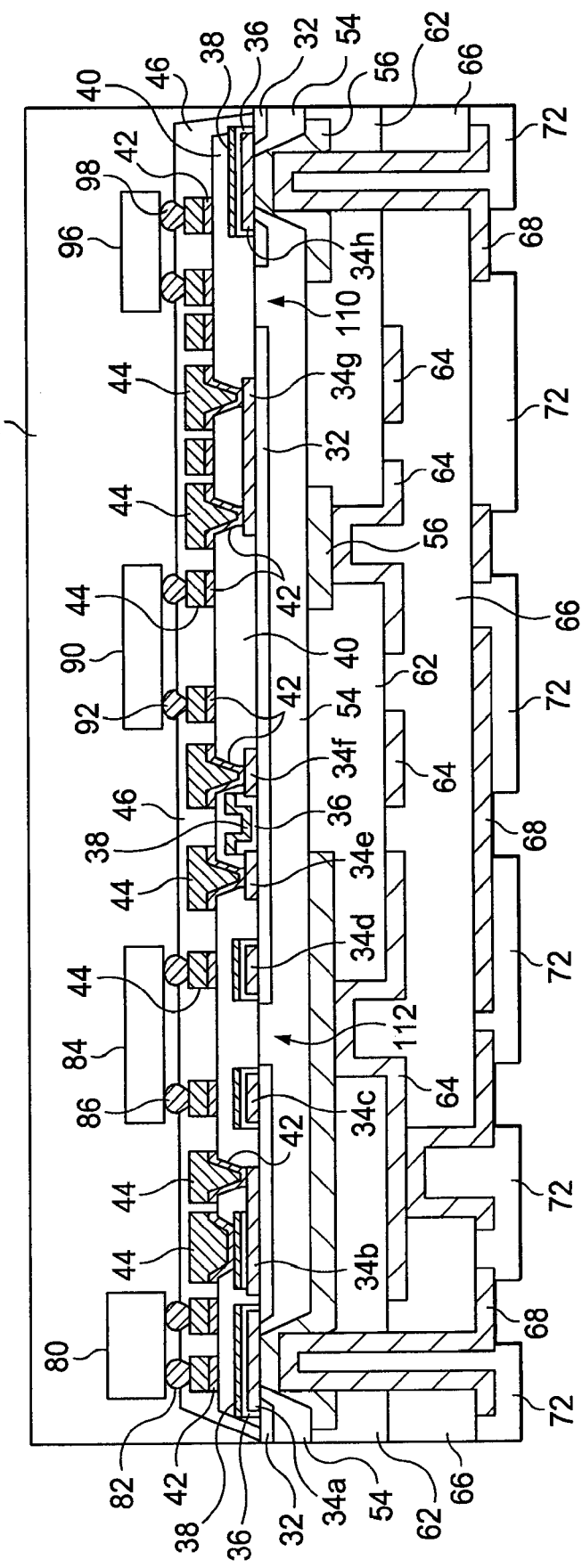
FIG. 5 illustrates a system in a package with a molding compound deposited over the passivation layer and the components.

In FIG. 5, optional underfill 88 and 94 and encapsulant 104 have not been applied during fabrication of the semiconductor device. Instead, molding compound 114 is applied over passivation layer 46 and components 80, 84, 90, and 96. Molding compound 114 can be applied by printing or compressive molding. For example, molding compound can be X8710F3A from Matsushita, X80280S from Sumitomo, or GE-100LFCG from Nitto, or other molding compound material with proper CTE, shrinkage rate, dielectric constant, loss tangent, resistivity, and mechanical or thermal strength. The insulation layer 32 is etched to provide notches 110 and 112 that enhance the physical connection between polymer film 54 and insulation layer 32, thereby providing for greater physical integrity of the semiconductor device.

Figure 6:
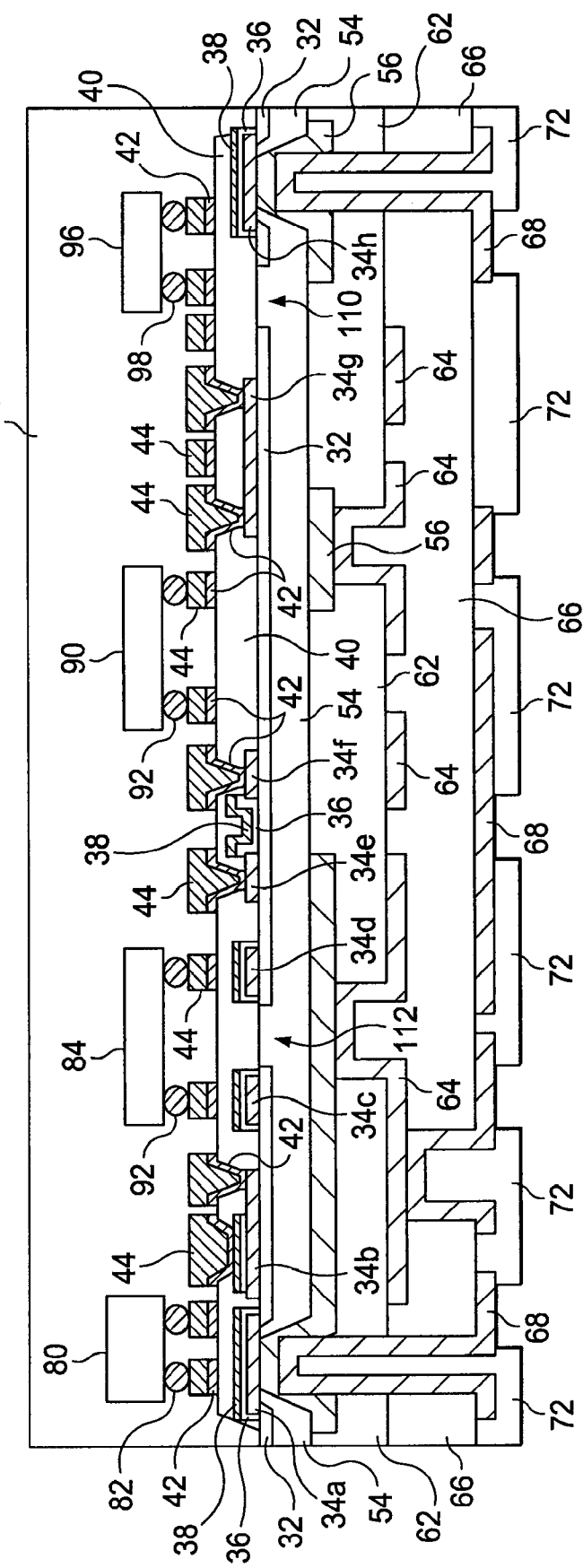
FIG. 6 illustrates a system in a package without a final passivation layer formed over the wafer.

In FIG. 6, components 80, 84, 90, and 96 are coupled to conductive layer 44 using a suitable SMT, or flip-chip process before substrate 30 is removed. The additional underfill material is not formed between conductive layer 44 and components 80, 84, 90, and 96 to provide additional mechanical support. Passivation layer 46 is bypassed. Instead, mold compound 116 is formed over components 80, 84, 90, and 96, conductive layer 44, conductive layer 42, and passivation layer 40. In the present embodiment, the mounting process used to connect components 80, 84, 90, and 96 to conductive layer 44 in combination with mold compound 116 provides adequate mechanical support to the components. Once again, insulation layer 32 is etched to provide notches 110 and 112 that enhance the physical connection between polymer film 54 and insulation layer 32, thereby providing for greater system physical integrity. Finally, in the present embodiment, passivation layer 46 is not applied as a final passivation layer over wafer 28 during thin-film processing.

Figure 7:
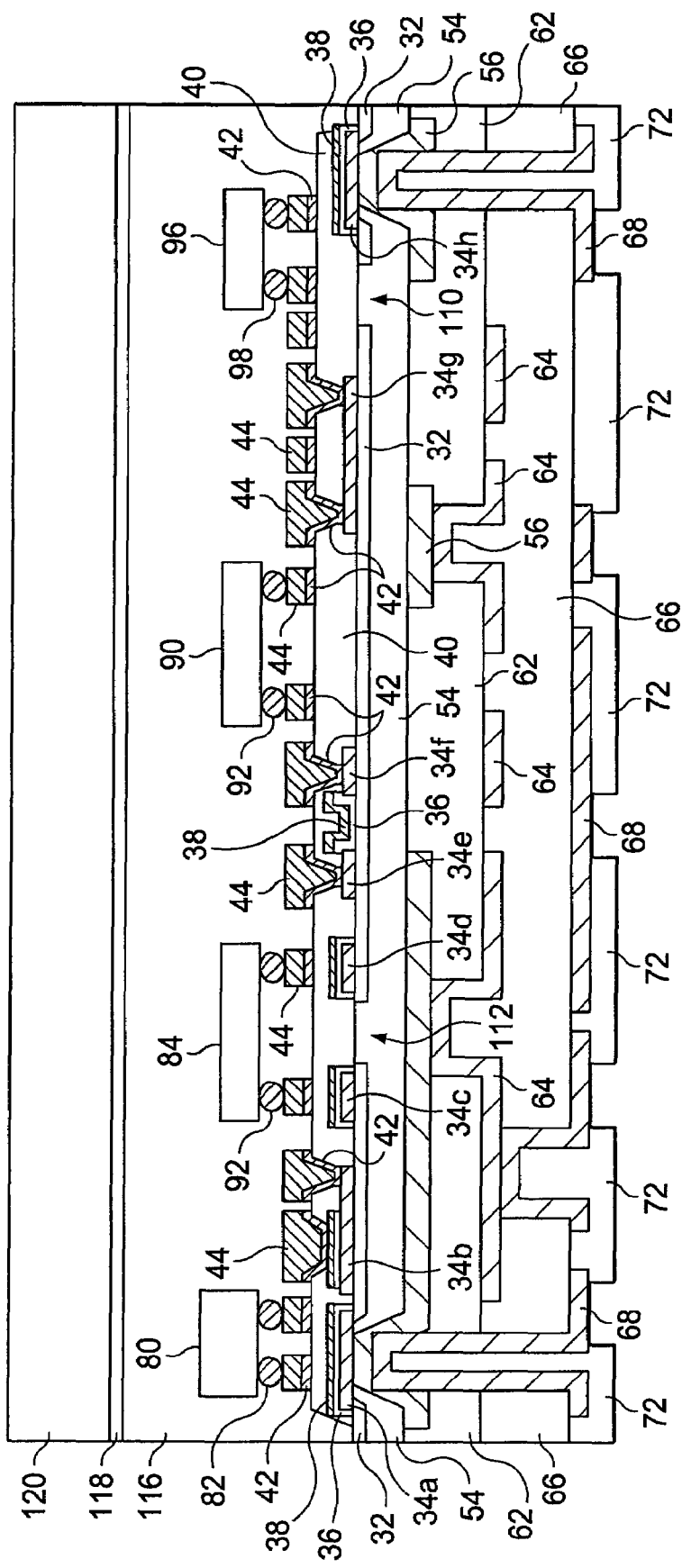
FIG. 7 illustrates a system in a package with an attached wafer carrier.

Turning to FIG. 7, a permanent supporting substrate 120 or wafer carrier is connected to mold compound 116 using a layer of adhesive 118. Permanent supporting substrate 120 can include glass, Si, ceramic, metal, polymer composite, or other rigid material.

Figure 8:
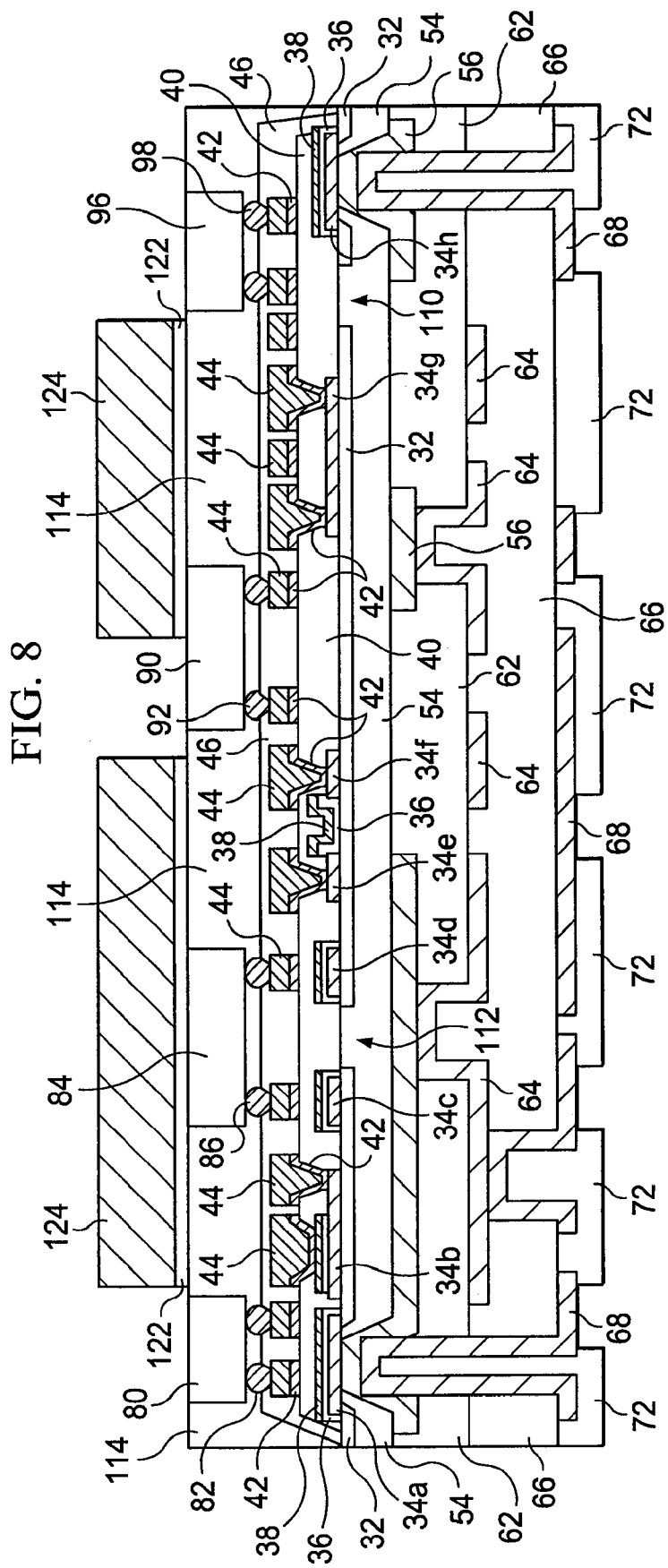
FIG. 8 illustrates a system in a package with a heat spreader mounted over the molding compound.

Turning to FIG. 8, a heat spreader 124 is mounted over molding compound 114 and embedded components 80, 84, 90, and 96 using adhesive layers 122. Heat spreader 124 provides for improved thermal dissipation. Heat spreader 124 generally includes a metal material such as forged Cu.

The semiconductor devices in the various embodiments shown can be manufactured using tools and equipment commonly known in the art, such as wire bonding, patterning, etching and similar equipment. The semiconductor devices serve to continue to advance technology for the integration of several components at reduced fabrication cost, while resulting in larger overall repeatable quality.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of manufacturing a semiconductor device, comprising:
   providing a first temporary substrate with an insulation layer disposed on a top surface of the first temporary substrate;
   forming an integrated passive circuit over a first surface of the insulation layer by,
   (a) forming a first conductive layer over the first surface of the insulation layer,
   (b) forming a dielectric layer over the first conductive layer, and
   (c) forming a second conductive layer over the dielectric layer;
   mounting a second temporary substrate over the integrated passive circuit;
   removing the first temporary substrate;
   depositing an insulating polymer film layer over a second surface of the insulation layer opposite the first surface of the insulation layer;
   forming an interconnect structure over the insulating polymer film layer; and
   removing the second temporary substrate.

2. The method of claim 1, including bonding a permanent support substrate to the semiconductor device.

3. The method of claim 1, including electrically connecting a semiconductor die to the integrated passive circuit.

4. The method of claim 1, including:
   etching a notch into the insulation layer; and
   depositing a portion of the insulating polymer film layer into the notch.

5. The method of claim 1, wherein removing the temporary substrate includes:
   removing a first amount of the temporary substrate using a grinding process; and
   removing a second amount of the temporary substrate using a wet dry, dry etch, or chemical-mechanical planarization process.

6. A method of manufacturing a semiconductor device, comprising:
   providing a temporary substrate with an insulation layer disposed on a top surface of the temporary substrate;
   forming an integrated passive circuit over a first surface of the insulation layer by forming a conductive layer wound to exhibit inductive properties over the first surface of the insulation layer;
   removing the temporary substrate; and
   mounting a printed circuit board over a second surface of the insulation layer opposite the first surface of the insulation layer, wherein the printed circuit board includes:
   an insulating polymer film layer, and
   an interconnect structure formed over the insulating polymer film layer.

7. The method of claim 6, including depositing a wafer carrier over the integrated passive circuit.

8. The method of claim 6, including bonding a permanent support substrate to the semiconductor device.

9. The method of claim 6, including electrically connecting a semiconductor die to the integrated passive circuit.

10. The method of claim 6, including:
    etching a notch into the insulation layer; and
    depositing an insulating polymer film into the notch.

11. The method of claim 6, wherein the step of removing the temporary substrate includes:
    removing a first amount of the temporary substrate using a grinding process; and
    removing a second amount of the temporary substrate using a wet dry, dry etch, or chemical-mechanical planarization process.

12. A method of manufacturing a semiconductor device, comprising:
    providing a temporary substrate having an insulation layer disposed on a top surface of the temporary substrate;
    forming an integrated passive circuit over a first surface of the insulation layer by:
    depositing a conductive layer over the first surface of the insulation layer, and depositing a dielectric layer over the conductive layer;
forming a passivation layer over the integrated passive circuit;
etching a first opening in the passivation layer to expose a first surface of the integrated passive circuit;
removing the temporary substrate;
etching a first opening in the insulation layer to expose a second surface of the integrated passive circuit;
depositing an insulating polymer film over a second surface of the insulation layer opposite the first surface of the insulation layer; and
forming a conductive layer over the insulating polymer film, wherein the conductive layer contacts the second surface of the integrated passive circuit.

13. The method of claim 12, including electrically connecting a semiconductor die to the exposed first surface of the integrated passive circuit.

14. The method of claim 12, wherein removing the temporary substrate includes:
removing a first amount of the temporary substrate using a grinding process; and
removing a second amount of the temporary substrate using a wet dry, dry etch, or chemical-mechanical planarization process.

15. The method of claim 12, including forming a solder mask over the conductive layer.

16. The method of claim 12, including:
etching a notch into the insulation layer; and
depositing a portion of the insulating polymer film into the notch.

17. The method of claim 13, including depositing molding material over the exposed first surface of the integrated passive circuit and semiconductor die.

18. The method of claim 15, including forming a conformal conductive layer underneath the solder mask, the conformal conductive layer penetrating the insulating polymer film.

19. A method of manufacturing a semiconductor device, comprising:
providing a temporary substrate with an insulation layer deposited on a top surface of the temporary substrate;
forming an integrated passive circuit over a first surface of the insulation layer;
removing the temporary substrate;
depositing an insulating polymer film layer over a second surface of the insulation layer opposite the first surface of the insulation layer;
depositing an interconnect structure over the insulating polymer film layer; and
bonding a wafer carrier over the integrated passive circuit.

20. A method of manufacturing a semiconductor device, comprising:
providing a temporary substrate with an insulation layer deposited on a top surface of the temporary substrate;
forming an integrated passive circuit over a first surface of the insulation layer;
removing the temporary substrate;
depositing an insulating polymer film layer over a second surface of the insulation layer opposite the first surface of the insulation layer;
depositing an interconnect structure over the insulating polymer film layer; and
bonding a permanent support substrate to the semiconductor device.

21. The method of claim 19, including electrically connecting a semiconductor die to the integrated passive circuit.

22. A method of manufacturing a semiconductor device, comprising:
providing a temporary substrate with an insulation layer deposited on a top surface of the temporary substrate;
forming an integrated passive circuit over a first surface of the insulation layer;
removing the temporary substrate by,
(a) removing a first amount of the temporary substrate using a grinding process, and
(b) removing a second amount of the temporary substrate using a wet dry, dry etch, or chemical-mechanical planarization process;
depositing an insulating polymer film layer over a second surface of the insulation layer opposite the first surface of the insulation layer; and
depositing an interconnect structure over the insulating polymer film layer.

* * * * *